US011766692B2

(12) United States Patent
Hausner et al.

(10) Patent No.: US 11,766,692 B2
(45) Date of Patent: Sep. 26, 2023

(54) DEVICE FOR APPLYING A VISCOUS MATERIAL TO WORKPIECES

(71) Applicant: Atlas Copco IAS GmbH, Bretten (DE)

(72) Inventors: Thomas Hausner, Bretten (DE); David Jaeger, Bruchsal (DE); Gerrit Enderle, Knittlingen (DE)

(73) Assignee: Atlas Copco IAS GmbH, Bretten (DE)

( * ) Notice: Subject to any disclaimer, the term of this patent is extended or adjusted under 35 U.S.C. 154(b) by 705 days.

(21) Appl. No.: 16/966,774

(22) PCT Filed: Jan. 8, 2019

(86) PCT No.: PCT/EP2019/050287
§ 371 (c)(1),
(2) Date: Jul. 31, 2020

(87) PCT Pub. No.: WO2019/166139
PCT Pub. Date: Sep. 6, 2019

(65) Prior Publication Data
US 2021/0039130 A1 Feb. 11, 2021

(30) Foreign Application Priority Data
Mar. 2, 2018 (DE) ...................... 10 2018 104 835.1

(51) Int. Cl.
*B05C 5/02* (2006.01)
*B05C 11/10* (2006.01)
*H05K 13/04* (2006.01)

(52) U.S. Cl.
CPC ........ *B05C 5/0225* (2013.01); *B05C 11/1034* (2013.01); *B05C 11/1028* (2013.01); *H05K 13/0469* (2013.01)

(58) Field of Classification Search
None
See application file for complete search history.

(56) References Cited

U.S. PATENT DOCUMENTS

| 6,220,571 | B1 * | 4/2001 | Kim | F16K 31/047 |
| | | | | 251/903 |
| 6,514,569 | B1 | 2/2003 | Crouch | |
| 9,964,127 | B2 | 5/2018 | Burmester et al. | |
| 2006/0193969 | A1 * | 8/2006 | Prentice | B05C 5/0233 |
| | | | | 118/683 |
| 2008/0308657 | A1 * | 12/2008 | Ando | F02M 61/1873 |
| | | | | 239/533.12 |
| 2013/0313340 | A1 | 11/2013 | Hong et al. | |

FOREIGN PATENT DOCUMENTS

| CN | 202789820 U | 3/2013 |
| CN | 104024710 A | 9/2014 |

(Continued)

OTHER PUBLICATIONS

Notification of Provisional Rejection (Office Action) in Korean Patent Application No. 10-2020-7024557 issued by the Korean Intellectual Property Office dated Mar. 19, 2023, with an English translation thereof.

(Continued)

Primary Examiner — Michael P. Rodriguez
(74) Attorney, Agent, or Firm — Collard & Roe, P.C.

(57) ABSTRACT

A device for applying a viscous material to workpieces includes a housing, an application channel extending in the housing up to an outlet opening, and a needle valve for opening and closing the application channel at a valve seat. An actuating element is mounted in the housing for rotation about a rotational axis extending parallel to a longitudinal direction in which the valve needle of the needle valve is movable relative to the housing. The actuating element has, in the radial lateral surface thereof, a guide groove extending circumferentially all around and curved in the axial direction in which at least one pin extending in the radial direction engages. The valve needle is connected to the actuating element or the at least one pin so that rotation of the actuating element about the rotational axis causes movement of the valve needle relative to the housing in the longitudinal direction.

13 Claims, 1 Drawing Sheet

(56) References Cited

FOREIGN PATENT DOCUMENTS

| | | |
|---|---|---|
| CN | 104100372 A | 10/2014 |
| DE | 8915649 U1 | 1/1991 |
| DE | 42 17 835 A1 | 12/1993 |
| DE | 20 2009 013 146 U1 | 3/2010 |
| DE | 10 2014 016 207 A1 | 5/2016 |
| FR | 2 877 707 A1 | 5/2006 |
| KR | 1020020073504 A | 9/2002 |
| KR | 101290744 B1 | 7/2013 |
| WO | 2018/118686 A1 | 6/2018 |

OTHER PUBLICATIONS

Chinese Office Action in CN 201980014309.7, dated Aug. 27, 2021, with English translation.
English translation of the International Preliminary Report on Patentability of the International Searching Authority in PCT/EP2019/050287, dated Jan. 8, 2019.
International Search Report in PCT/EP2019/050287, dated Apr. 23, 2019.
German Search Report dated Nov. 14, 2018 in German Application No. 10 2018 104 835.1, with English translation of relevant parts.
Response to European Patent Office dated Dec. 4, 2019 regarding PCT/EP2019/050287, with English translation of relevant parts.

* cited by examiner

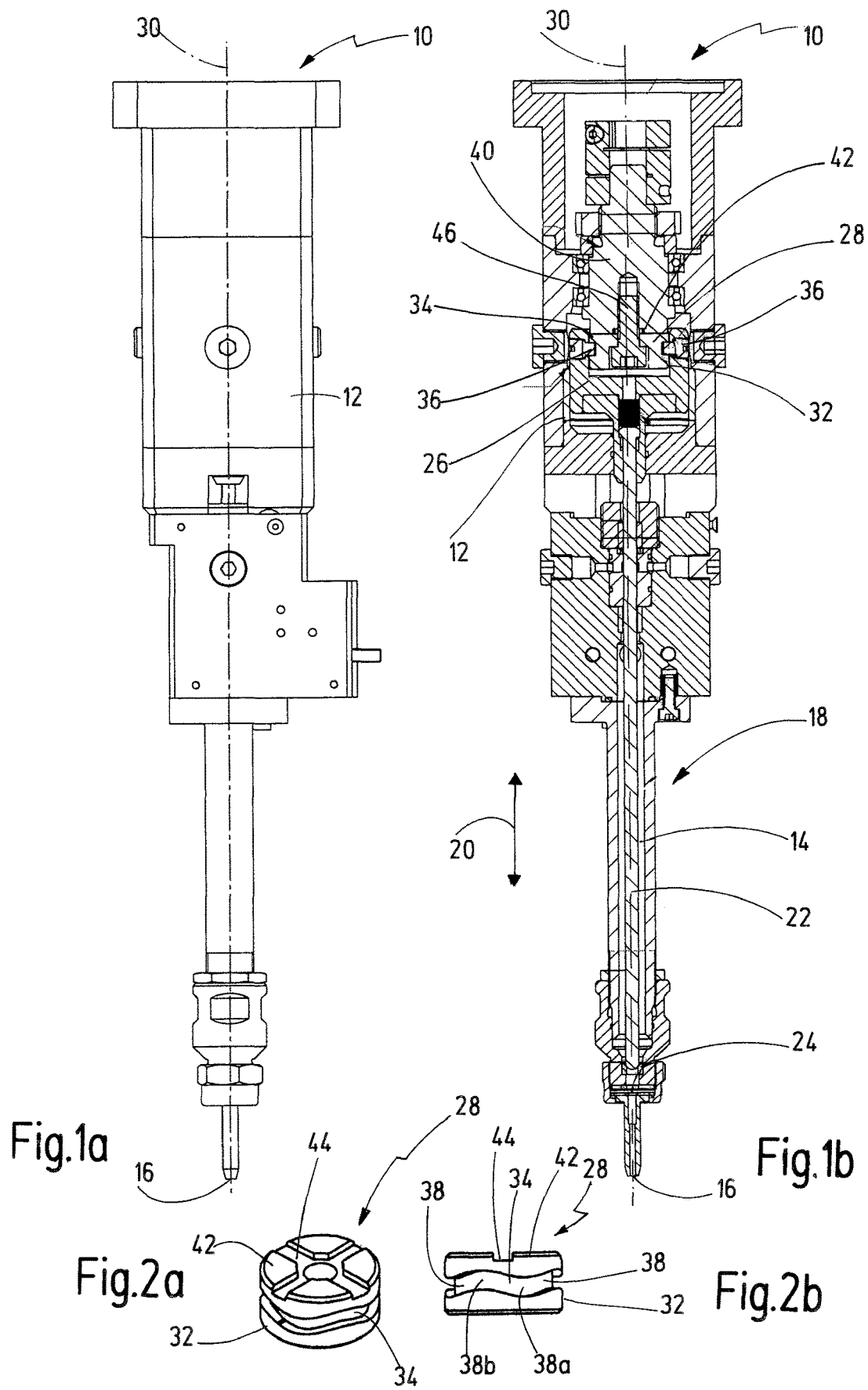

DEVICE FOR APPLYING A VISCOUS MATERIAL TO WORKPIECES

CROSS REFERENCE TO RELATED APPLICATIONS

This application is the National Stage of PCT/EP2019/050287 filed on Jan. 8, 2019, which claims priority under 35 U.S.C. § 119 of German Application No. 10 2018 104 835.1 filed on Mar. 2, 2018, the disclosure of which is incorporated by reference. The international application under PCT article 21(2) was not published in English.

The invention relates to a device for application of a viscous material to workpieces in accordance with the preamble of claim 1.

Such devices serve for application of viscous material such as adhesive, sealant, insulation or heat conduction paste, for example, to a workpiece such as a car body part in motor vehicle production, for example. Depending on the field of application and the type of material, it can be necessary to apply continuous material beads or, instead, individual material dots, which are arranged at a distance from one another. In the case of application of individual material dots, the problem exists that a valve of the application device must be opened and closed during application of each material dot. In the case of a rapid time sequence of opening and closing procedures, the use of quick-switching valves is required. In the case of previously known application devices, for this purpose a disk is provided with an opening, in each instance, which disk is rotated back and forth so as to alternately release the application channel and close it again. The faster the sequence of the applied material dots is supposed to be, the faster the disk must be accelerated and braked again for release and then closure of the application channel. Powerful motors are then required to drive the disk, which motors have high power consumption and a large size.

It is therefore the task of the invention to further develop a device of the type stated initially, in such a manner that the application of material dots is improved.

This task is accomplished, according to the invention, by means of a device having the characteristics of claim 1. Advantageous further developments of the invention are the object of the dependent claims.

The invention is based on the idea that the actuation element can be rotated at high speed, and the valve needle moves back and forth in the axial direction by means of this movement around the housing-fixed axis of rotation, due to the engagement of the at least one pin in the guide groove and due to the connection with the at least one pin or the actuation element. The guide groove runs around the mantle surface of the actuation element and is closed in itself, so that the valve needle always returns to its starting position with reference to the housing after a rotation of the actuation element by 360 degrees, and constantly alternately releases the feed channel and closes it again while doing so. In this regard, it is possible that the actuation element is mounted in the housing so as to be non-displaceable in the longitudinal direction, and that the at least one pin is firmly connected with the valve needle and is mounted so as to be displaceable in the housing in the longitudinal direction, or, alternatively, that the at least one pin is fixed in place on the housing and that the valve needle is firmly connected with the actuation element. In this regard, constant acceleration and braking of the actuation element is generally not required. The energy-intensive acceleration and braking of a closing body, as in the case of previously known devices, which requires great motor power, is eliminated to a great extent, in this regard. The number of material dots that are dispensed per time unit can furthermore be controlled in simple manner, by means of a change in the speed of rotation. The use of a less powerful motor, which has a smaller size, furthermore decreases the space requirement. Furthermore, it is possible to open the exit opening in defined manner by means of defined rotation of the actuation element, so as to regulate the material flow. In particular, material beads can also be applied, wherein the thickness of the material bead is defined by means of the position of the actuation element in the housing.

It is practical if at least two pins are provided, which engage into the guide groove, and which are preferably arranged at equal angle distances from one another. This measure ensures more stable guidance of the actuation element in the housing. In this regard, it is possible that the guide groove has a first part, curved in a first direction, as well as a second part that follows the first part and is curved in the opposite direction, so that during rotation of the actuation element in the housing by 360°, the element is moved back and forth precisely once. In order to increase the opening and closing frequency of the needle valve without having to increase the speed of rotation of the actuation element in the housing for this purpose, it can advantageously be provided that the guide groove has multiple identical sections that follow one another. Each of these sections then has a first part having a curvature in the first direction, and a second part having a curvature in the opposite second direction that follows the first, so that the actuation element performs multiple back and forth movements in the housing during a rotation by 360° in the housing, and opens and closes the needle valve multiple times. It is practical if the first and second parts have the same length, in each instance.

It is practical if the device according to the invention has a motor for rotating the actuation element, which is advantageously configured as an electric motor and, in particular, as a servomotor. Furthermore, it is preferred that the motor is releasably fastened onto the housing, so that it can be replaced in simple manner. It is advantageous if the motor drives a drive element that is connected with the actuation element by means of friction fit or shape fit. In addition, it can be fixed in place on the actuation element by means of a preferably releasable connection. In the case of a loose connection between the drive element and the actuation element, the drive element does not have to be released from the actuation element in complicated manner when it is supposed to be replaced together with the motor. It is practical if the actuation element then has an engagement contour at the end-face surface that faces away from the valve seat, into which contour the drive element engages. The engagement contour preferably has the shape of a cross-slot, while the drive element has a shape complementary to this.

With the device according to the invention, it is possible to perform a method for application of a viscous material to workpieces. In this regard, the viscous material is introduced into the application channel under the effect of pressure, and the needle valve is periodically opened and closed by means of rotation of the actuation element in the housing, by lifting the valve needle off the valve seat and setting the valve needle onto the valve seat. The frequency at which material dots are dispensed can be easily varied in this manner, by means of a change in the speed of rotation of actuation element. In the case of an alternative application method, a defined material flow through the exit opening is adjusted by means of a targeted rotation of the actuation element with reference to the housing and a linear movement of the valve needle resulting from it.

In the following, the invention will be explained in greater detail using an exemplary embodiment shown schematically in the drawing. The figures show:

FIG. 1a a device for application of a viscous material in a side view;

FIG. 1b the device according to FIG. 1a in a sectional representation along the line A-A and FIG. 2a, 2b an actuation element in a perspective view and a side view.

The device 10 shown in the drawing serves for application of viscous material such as adhesive, sealant, insulation or heat conduction paste onto workpieces. It has a housing 12, through which an application channel 14 runs all the way to an exit opening 16, by way of which the viscous material is guided to the workpiece for application. A needle valve 18 is arranged in the housing 12, which valve has a valve needle 22 that can be displaced in a longitudinal direction 20 and extends in the longitudinal direction 20, which needle is set onto a valve seat 24 to close the application channel 14 and lifted off from the valve seat 24 to release the application channel 14.

The valve needle 22 is firmly connected with a sleeve 26 that is displaceable in the housing, to a limited extent, in the longitudinal direction, in which sleeve an actuation element 28 is accommodated. The actuation element 28 can rotate in the housing 12 about an axis of rotation 30 that extends parallel to the longitudinal direction 20, and is arranged to be non-displaceable in the longitudinal direction 20 with reference to the housing 12. It has a radial mantle surface 32 in which a guide groove 34 that runs circumferentially is disposed, into which groove two pins 36 engage, which lie diametrically opposite one another, are firmly connected with the sleeve 26, and extend inward in the radial direction. The guide groove 34 is closed in itself and curved in the axial direction 20, so that a rotation of the actuation element 28 with reference to the housing 12 results in a linear movement of the pins 36, the sleeve 26, and the valve needle 22 between two end positions. In this regard, the guide groove 34 has two identical sections 38, which each extend over half of the circumference of the mantle surface 32 and make a transition into one another. Each of the sections 38 has a first part 38a that is inclined downward to the valve seat 24, viewed in the direction of rotation, and a second part 38b that follows the first part 38a and is inclined upward, away from the valve seat 24, viewed in the direction of rotation. If the actuation element 28 is turned by 180° about the axis of rotation 30, the valve needle 22 gets back into its starting position. In order to open the valve needle 18 once and close it again, it is therefore sufficient to rotate the actuation element 28 by 180°, which element then converts its rotational movement into a linear movement of the sleeve and of the valve needle 22 in the housing 12.

For rotation of the actuation element 28, an electric motor configured as a servomotor is provided; it is not shown in the drawing. The servomotor drives a drive element 40 disposed in the housing 12, which in turn lies on an end-face surface 42 of the actuation element 28, facing away from the end-face surface 26. An engagement contour 44 in the form of a cross-slot is situated in the end-face surface 42, into which contour a complementary contour of the drive element 40 engages. The drive element 40 can be firmly connected with the servomotor and can be lifted off from the actuation element 28 and removed from the housing 12 together with the motor. Furthermore, it is releasably connected with the actuation element 28 by means of a screw 46.

The application device 10 can particularly be operated in two operation modes, wherein the viscous material is introduced into the application channel under the effect of pressure. For one thing, dots of the material can be applied to a workpiece in a rapid sequence, in that the actuation element 28 is rotated in the housing 12. The application frequency can be regulated by means of regulation of the rotation frequency of the actuation element 28. For another, a defined material flow through the exit opening 16 can be adjusted by means of targeted rotation of the actuation element 28 with reference to the housing 12.

As an alternative to the exemplary embodiment described above, in which the valve needle 22 is firmly connected with the pin 36 that can move linearly in the housing, by way of the sleeve 26, the valve needle 22 can also be firmly connected with the actuation element 28. The pins 36 are then fixed in place on the housing, and the rotation of the actuation element 28 about the axis of rotation 30 then brings about a linear back and forth movement of the actuation element 28 in the housing, with entrainment of the valve needle 22.

In summary, the following should be stated: The invention relates to a device 10 for application of a viscous material to workpieces, having a housing 12, having an application channel 14 that runs in the housing 12 all the way to an exit opening 16, and having a needle valve 18 for releasing and closing the application channel 14 at a valve seat 24. According to the invention, it is provided that an actuation element 28 is mounted in the housing 12 so as to rotate about an axis of rotation 30, wherein the axis of rotation 30 extends parallel to a longitudinal direction 20, in which the valve needle 22 of the needle valve 18 can be displaced with reference to the housing 12, that the actuation element 28 has a guide groove 34 in its radial mantle surface 32, which groove runs all the way around and is curved in the axial direction 20, into which groove at least one pin 36 that extends in the radial direction engages, and that the valve needle 22 is connected with the actuation element 28 or with the at least one pin 36 in such a manner that a rotation of the actuation element 28 about the axis of rotation 30 brings about a displacement of the valve needle 22 with reference to the housing 12, in the longitudinal direction 20.

The invention claimed is:

1. A device for application of a viscous material to workpieces, having a housing (12), having an application channel (14) that runs in the housing (12) all the way to an exit opening (16), and having a needle valve (18) for releasing and closing the application channel (14) at a valve seat (24), wherein an actuation element (28) is mounted in the housing (12) so as to rotate about an axis of rotation (30), wherein the axis of rotation (30) extends parallel to a longitudinal direction (20), in which the valve needle (22) of the needle valve (18) can be displaced with reference to the housing (12), wherein the actuation element (28) has a guide groove (34) in its radial mantle surface (32), which groove runs all the way around and is curved in the axial direction (20) and is closed in itself, into which groove at least one pin (36) that extends in the radial direction engages, and wherein the valve needle (22) is connected with the actuation element (28) or with the at least one pin (36) in such a manner that a rotation of the actuation element (28) about the axis of rotation (30) brings about a displacement of the valve needle (22) with reference to the housing (12), in the longitudinal direction (20).

2. The device according to claim 1, wherein the actuation element (28) is mounted in the housing (12) so as to be non-displaceable in the longitudinal direction (20), and that the at least one pin (36) is firmly connected with the valve needle (22) and is mounted so as to be displaceable in the housing (12) in the longitudinal direction (20).

3. The device according to claim 1, wherein the at least one pin (36) is fixed in place on the housing and that the valve needle (22) is firmly connected with the actuation element (28).

4. The device according to claim 1, wherein at least two pins (36) are provided, which engage into the guide groove (34).

5. The device according to claim 1, wherein the guide groove (34) has multiple identical sections (38) that follow one another.

6. The device according to claim 1, comprising a motor for rotation of the actuation element (28).

7. The device according to claim 6, wherein the motor is an electric motor.

8. The device according to claim 6, wherein the motor is releasably fastened onto the housing (12).

9. The device according to claim 6, wherein the motor drives a drive element (40) that is connected with the actuation element (28) by means of friction fit or shape fit.

10. The device according to claim 9, wherein the actuation element (28) has an engagement contour (44) at the end-face surface (42) that faces away from the valve seat (24), into which contour the drive element (40) engages.

11. The device according to claim 10, wherein the engagement contour (44) has the shape of a cross-slot.

12. A method for application of a viscous material to workpieces, using the device (10) according to claim 1, wherein the viscous material is introduced into the application channel (14) under the effect of pressure, and wherein the needle valve (18) is periodically opened and closed by means of rotation of the actuation element (28) in the housing (12), by lifting the valve needle (22) off the valve seat (24) and setting the valve needle (22) onto the valve seat (24).

13. A method for application of a viscous material to workpieces, using the device (10) according to claim 1, wherein the viscous material is introduced into the application channel (14) under the effect of pressure, and wherein a material flow through the exit opening (16) is regulated by means of rotation of the actuation element (28) with reference to the housing (12).

* * * * *